(12) United States Patent
Lee

(10) Patent No.: US 10,825,691 B1
(45) Date of Patent: Nov. 3, 2020

(54) SEMICONDUCTOR STRUCTURE STACK

(71) Applicant: Micron Technology, Inc., Boise, ID (US)

(72) Inventor: Che-Chi Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/555,470

(22) Filed: Aug. 29, 2019

(51) Int. Cl.
*H01L 21/311* (2006.01)
*H01L 21/02* (2006.01)
*H01L 27/108* (2006.01)

(52) U.S. Cl.
CPC .... *H01L 21/31144* (2013.01); *H01L 21/0217* (2013.01); *H01L 21/0228* (2013.01); *H01L 21/02142* (2013.01); *H01L 21/02183* (2013.01); *H01L 21/02186* (2013.01); *H01L 21/02194* (2013.01); *H01L 21/02208* (2013.01); *H01L 27/10894* (2013.01)

(58) Field of Classification Search
None
See application file for complete search history.

(56) References Cited

U.S. PATENT DOCUMENTS

| 7,662,693 | B2 | 2/2010 | Bhattacharyya | |
|---|---|---|---|---|
| 7,875,529 | B2 | 1/2011 | Forbes et al. | |
| 8,274,777 | B2 | 9/2012 | Kiehlbauch | |
| 2012/0064682 | A1* | 3/2012 | Jang | H01L 27/11578 438/268 |
| 2017/0278859 | A1* | 9/2017 | Sharangpani | H01L 27/11582 |
| 2018/0069020 | A1* | 3/2018 | Park | G03F 7/0046 |
| 2019/0189631 | A1* | 6/2019 | Lee | H01L 21/31111 |

\* cited by examiner

*Primary Examiner* — Asok K Sarkar
(74) *Attorney, Agent, or Firm* — Brooks, Cameron & Huebsch, PLLC

(57) ABSTRACT

Methods, apparatuses, and systems related to stack a semiconductor structure are described. An example method includes stacking a semiconductor structure between electrode materials having a first silicate material on a working surface. The method further includes forming a first nitride material on the first silicate material. The method further includes forming a second silicate material on the first nitride material. The method further includes forming a second nitride material on the second silicate material. The method further includes forming a third silicate material on the second nitride. The method further includes forming a third nitride on the third silicate material. The method further includes using a wet etch process to increase a width between electrode materials. The method further includes using a dry etch process to remove a portion of materials within the semiconductor structure.

24 Claims, 7 Drawing Sheets

SEMICONDUCTOR STRUCTURE STACK

TECHNICAL FIELD

The present disclosure relates generally to semiconductor devices and methods, and more particularly to a semiconductor structure stack.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
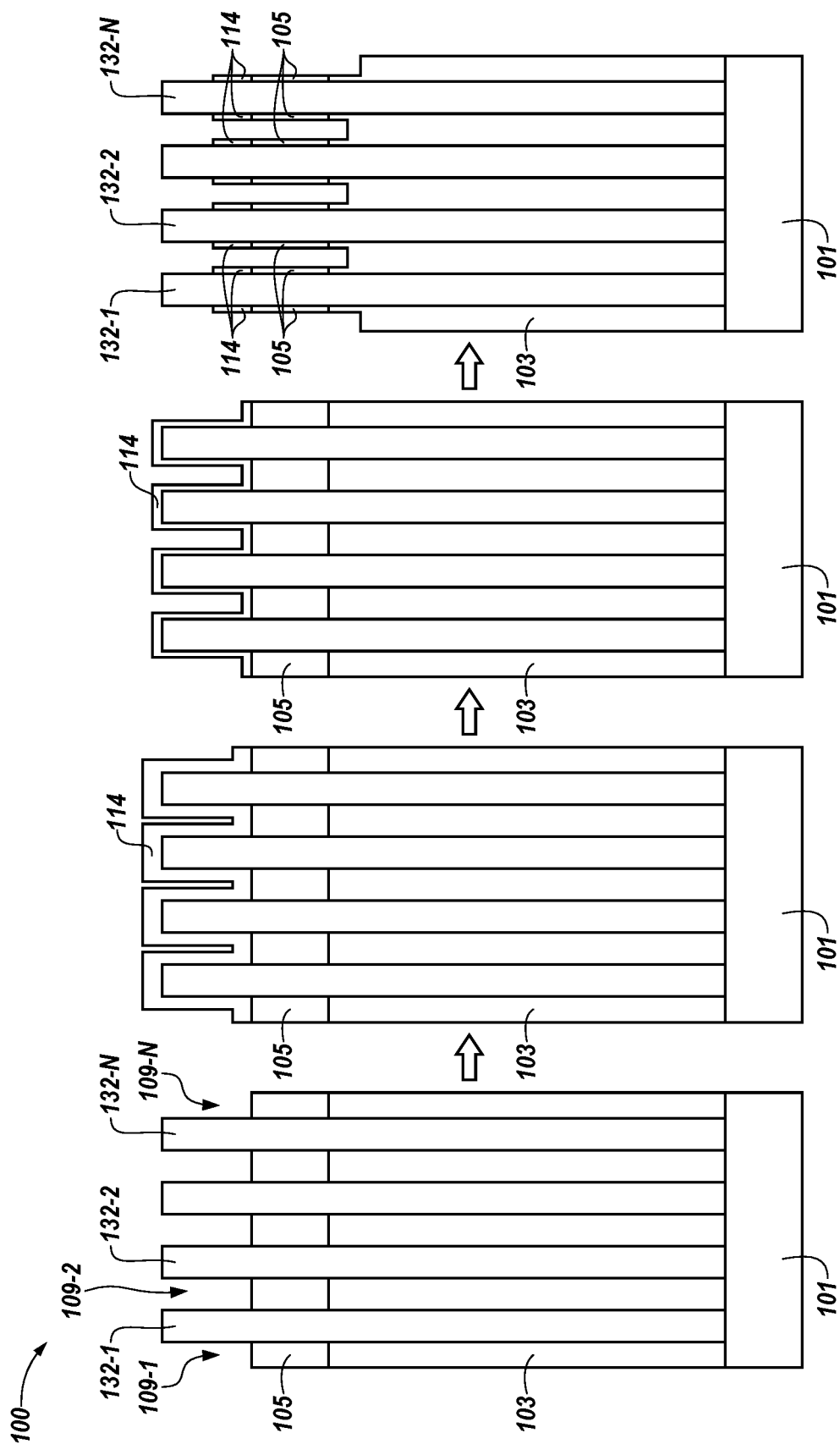
FIGS. 1-4 illustrate cross-sectional views of a portion of a semiconductor structure of a memory device in association with a semiconductor fabrication sequence for stacking a semiconductor structure in accordance with a number of examples of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a working surface. Such openings may contain, or be associated with, various materials that contribute to data access, storage, and/or processing, or to various support structures, on the memory device. As an example, capacitor material may be deposited into these openings to provide the data access, storage, and/or processing.

In order to increase the capacitance of a cell of the memory device, a surface area of a semiconductor working surface formed into a column can be increased by increasing the height of the capacitor material column within the openings. However, as capacitor columns increase in height with pillars having higher aspect ratios, it may increase the risk of bending and wobbling of the capacitor column, and can cause possible shorts. The high aspect ratio while causing an increase in the column height may mean a decrease in capacitor width. The small pitch of the capacitor material column may also create difficulty in filling the openings with capacitor material.

In order to mitigate this issue, a method for stacking a semiconductor structure is described further below. As an example, a semiconductor structure may be formed to include a silicate material and a nitride material. An electrode material may be deposited. A wet etch process may be used to widen the gap between the electrode materials. A dry etch process may be used to etch a portion of the nitride material. A second silicate material and nitride material may be stacked on the initial semiconductor structure. A third silicate material and nitride material may be stacked on the second silicate material. A wet etch process may be used to widen the gap between the electrode materials. A dry etch process may be used to etch a portion of the materials within the semiconductor structure, particularly the nitride material.

The present disclosure includes methods, apparatuses, and systems related to stack a semiconductor structure, resulting in increased capacitor height and width. For example, in a previous approach, a semiconductor structure may have a high aspect ratio (AR) of the height to width being in a range of approximately 25:1 to approximately 50:1. Here, the AR may be in a range of approximately 25:1 to approximately 75:1. The self-aligned structure may be used to increase the semiconductor structure width.

In one example, the capacitance may be increased through the widened semiconductor structure width. An example method includes stacking a semiconductor structure between electrode materials having a first silicate material on a working surface. The method further includes forming a first nitride material on the first silicate material. The method further includes forming a second silicate material on the first nitride material. The method further includes forming a second nitride material on the second silicate material, forming a third silicate material on the second nitride, and forming a third nitride on the third silicate material. The method further includes using a wet etch process to increase a width between electrode materials. The method further includes using a dry etch process to remove a portion of materials within the semiconductor structure.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 103 may reference element "03" in FIG. 1, and a similar element may be referenced as 203 in FIG. 2. In some instances, a plurality of similar, but functionally and/or structurally distinguishable, elements or components in the same figure or in different figures may be referenced sequentially with the same element number (e.g., 124-1, 124-2, 124-3, 124-4 in FIG. 2).

FIG. 1 illustrates a cross-sectional view 100 of a portion of a semiconductor structure of a memory device in association with a semiconductor fabrication sequence for stacking a semiconductor structure in accordance with a number of examples of the present disclosure. The example memory device 100 can include a plurality of pillars 109-1, 109-2, . . . , 109-N (hereinafter referred to collectively as plurality of pillars 109). Each of the plurality of pillars 109 may include a first silicate material 103, shown to have been formed on an underlying substrate material 101. The working surface 101 may be formed from various undoped or doped materials on which memory device materials may be fabricated. Examples of a relatively inert undoped working surface 101 may include monocrystalline silicon (monosilicon), polycrystalline silicon (polysilicon), and amorphous silicon, among other possibilities.

The first silicate material 103 may, in a number of examples, have been formed from borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, and/or formation of the first silicate material 103, as described herein.

The first silicate material 103 may be originally formed (e.g., deposited) over a surface of the underlying working surface 101. The first silicate material 103 may, in a number of examples, be deposited to a thickness in a range of approximately 200 nanometers (nm) to approximately 750 nm above the surface of the underlying working surface 101. However, embodiments of the present disclosure are not limited to this example.

A first nitride material 105 may be formed over a surface of the first silicate material 103 opposite from the underlying working surface 101. The first nitride material 105 may be formed (e.g., deposited) over an upper surface of the first silicate material 103. The first nitride material 105 may be formed from a nitride material selected for dielectric properties For example, one or more dielectric and/or resistor nitrides may be selected from boron nitride (BN), silicon nitride (SiNx, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material 105. The first nitride material 105 may, in a number of examples, be deposited to a thickness in a range of approximately 5 nm to approximately 65 nm above the surface of the first silicate material 103. However, embodiments of the present disclosure are not limited to this example.

A capacitor material, e.g., an electrode material 132 (hereinafter referred to, individually or collectively as electrode material 132), may be formed (e.g., deposited) between the plurality of pillars 109. The electrode material 132, e.g., a bottom electrode, may be formed (e.g., deposited) from the working surface 101 to a height above the first nitride material 105 at the upper surface of the plurality of pillars 209 through a conformal deposition process such as chemical vapor deposition (CVD). For example, the spaces between the plurality of pillars 109 may be covered by the electrode material 132. For clarity in the example fabrication sequence, the figures show a first electrode material 132-1 and a second first electrode material 132-2 but examples are not limited to two electrode materials and may include various numbers of electrode materials.

The electrode material 132 may be formed from a metal material selected for conductive properties. The electrode material 132 may be formed from transition metals such as tungsten (W), rhenium (Re), osmium (Os), iridium (Ir), platinum (Pt), titanium (Ti), zirconium (Zr), chromium (Cr), ruthenium (Ru), and palladium (Pd), among other possibilities. The electrode material 132 may also be formed from a nitride compound material selected for conductive properties. For example, one or more conductive nitrides may be selected from gallium nitride (GN), tantalum nitride (TaN, Ta2N), titanium nitride (TiN, Ti2N), aluminum doped titanium nitride (TiAlN), silicon doped titanium nitride (TiSiN), boron doped titanium nitride (TiBN), and tungsten nitride (WN, W2N, WN2), among other possibilities.

In order to increase the capacitance of a cell of the memory device, a surface area of the electrode material 132 may be increased by increasing the height of the electrode material 132. However, due to possible gap margins and smaller pitch, increasing the height of the electrode material 132 may reduce the space available for capacitor materials and poor electrical conduction. In order to widen the space between electrode materials 132, a spacer oxide material 114 may be deposited on the upper surfaces of the semiconductor structure. The spacer oxide material 114 may be deposited on the upper surface of the first nitride material 105 and the upper surface of the electrode materials 132. That is, the spacer oxide material 114 may be deposited on the upper surface of the first nitride material 105 and between electrode materials 132.

Each of the materials may contribute a particular height to the overall height of the structure. As is illustrated in FIG. 1, the first silicate material 103 can have a height 124-1 and the first nitride material 105 can have a height 124-2. In some examples, the height 124-1 of the first silicate material 103 can be one of approximately 2000 Angstroms, approximately 2400 Angstroms, approximately 3600 Angstroms, approximately 4000 Angstroms, approximately 4500 Angstroms, approximately 5300 Angstroms, approximately 5800 Angstroms, approximately 6200 Angstroms, approximately 7000 Angstroms, and/or within a range from approximately 2000 Angstroms to approximately 7500 Angstroms. In some examples, the height 124-2 of the first nitride material 105 can be one of approximately 50 Angstroms, approximately 100 Angstroms, approximately 400 Angstroms, approximately 600 Angstroms, and/or within a range from approximately 50 to approximately 650 Angstroms. However, embodiments of the present disclosure are not limited to this example.

A wet etch may be used to increase the space between electrode materials 132. The wet etch may be used to decrease the spacer oxide material 114 width, thereby increasing the width between electrode materials 132. The wet etch may be carried out using a dilute hydrofluoric (HF) acid combination. The HF may be diluted with water at a ratio between 500 to 2500 parts hydrofluoric acid to 1 part water. The HF may selectively target the spacer oxide material 114, but not the electrode material 132.

A dry etch may be subsequently used to etch a portion of the materials within the plurality of pillars 109, particularly the first nitride material 105. The dry etch may etch a portion of the spacer oxide material 114 and a portion of the first nitride material 105. The dry etch may be carried out using phosphoric acid. Performance of the dry etch process may allow for formation of an opening that extends from the upper surface of the first nitride material 105 to the surface of the first silicate material 103. The opening formed by the dry etch process may be used to deposit a new layer of silicate material and nitride material. The new layers may be deposited on the first silicate material 103 such that a second silicate material is seamlessly deposited onto the first silicate material 103.

Figure 2:
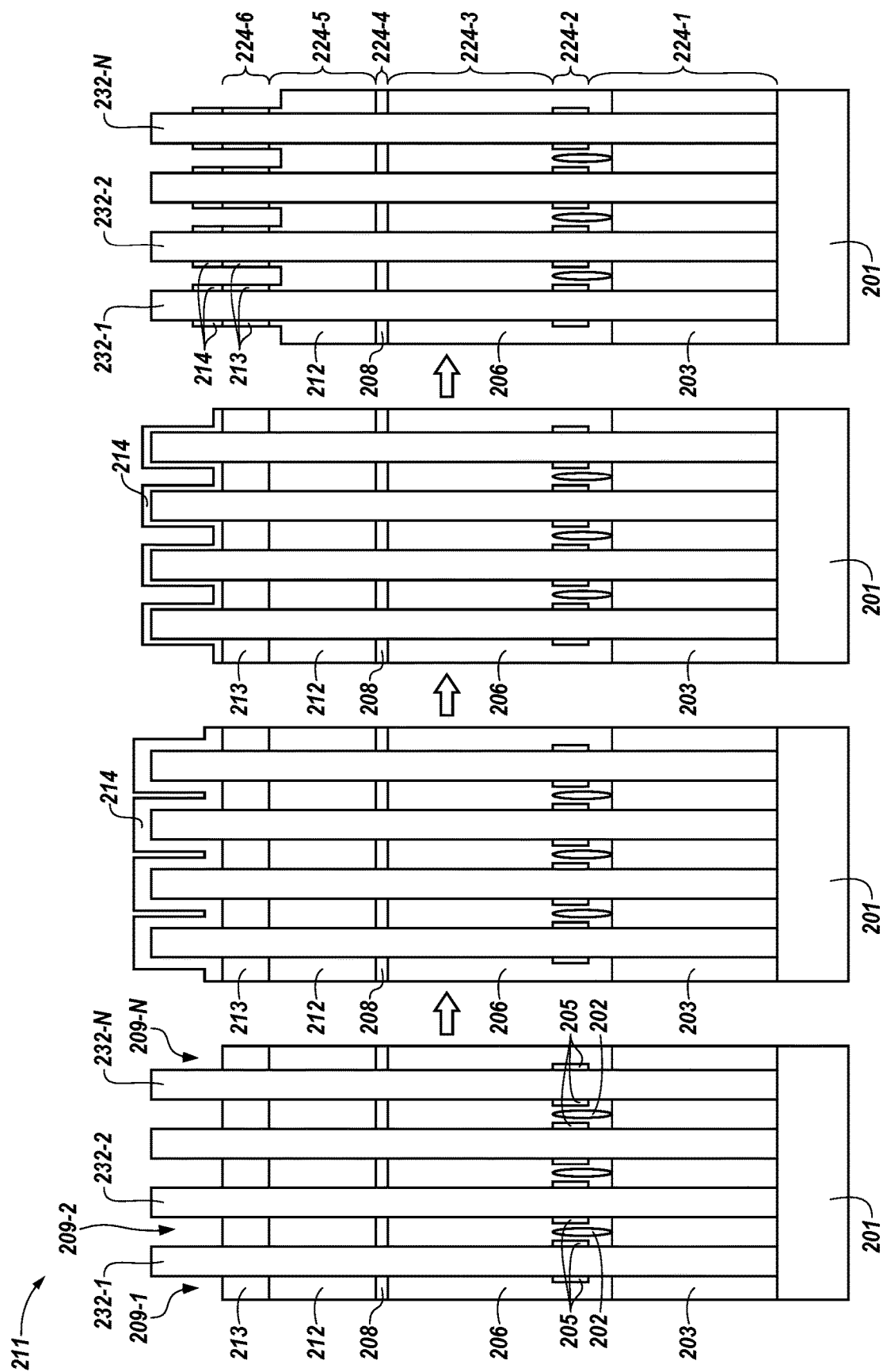

FIG. 2 illustrates a cross-sectional view 211 of a portion of semiconductor structure of a memory device in association with a semiconductor fabrication sequence for stacking a semiconductor structure in accordance with a number of examples of the present disclosure. FIG. 2 illustrates the example semiconductor structure at a particular stage following completion of the example fabrication sequence described in connection with FIG. 1.

The cross-sectional view 211 may include the same or similar elements as the example cross-sectional view 100 as referenced in FIG. 1. For example, the working surface 201 is analogous or similar to working surface 101. First silicate material 203 is analogous or similar to first silicate material 103, first nitride material 205 is analogous or similar to first nitride material 105, and electrode material 232 is analogous or similar to electrode material 132.

A second silicate material 206 is shown to have been formed over the first silicate material 203 opposite the working surface 201. Performance of the dry etch process described in FIG. 1 may etch away a portion of the first nitride material 205. The etch process may allow for formation of an opening 202 that extends from the upper surface of the first nitride material 205 to the surface of the first silicate material 203. The opening 202 may allow for a deposition of the second silicate material 206 onto the first silicate material 203 such that they appear to be a seamless whole. The second silicate material 206 may, in a number of examples, be formed from tetraethyl orthosilicate (Si(OC$_2$H$_5$)$_4$), which is also referred to as TEOS. TEOS may be formed as an ethyl ester of orthosilicic acid (Si(OH)$_4$), among other possibilities. The second silicate material 206 may, in a number of examples, be deposited to a thickness in a range of approximately 250 nm to 600 nm above the surface of the first nitride material 205. However, embodiments of the present disclosure are not limited to this example.

A second nitride material 208 is shown to have been formed over a surface of the second silicate material 206 opposite from a portion of the first nitride material 205 and the first silicate material 203. The second nitride material 208 may be formed (e.g., deposited) over an upper surface of the second silicate material 206.

Similar to the first nitride material 205, the second nitride material 208 may be formed from a nitride material selected for dielectric properties. For example, the second nitride material 208 may be formed from the same material as the first nitride material 205. The second nitride material 208 may, in a number of examples, be deposited to a thickness in a range of from approximately 50 nm to approximately 300 nm above the surface of the second silicate material 206.

A third silicate material 212 is shown to have been formed over the second nitride material 208 opposite the second silicate material 206. Similar to the first silicate material 203 and the second silicate material 206, the third silicate material 212 may be formed from a silicon compound. For example, the third silicate material 212 may be formed from the same material as the first silicate material 203. The third silicate material 212 may also be formed from the same material as the second silicate material 206. That is, the third silicate material 212 may be formed from BPSG or TEOS. The third silicate material 212 may, in a number of examples, be deposited to a thickness in a range of from approximately 100 nm to approximately 450 nm above the surface of the second silicate material 206.

A third nitride material 213 is shown to have been formed over a surface of the third silicate material 212 opposite from the second nitride material 208. The third nitride material 213 may be formed (e.g., deposited) over an upper surface of the third silicate material 212.

Similar to the first nitride material 205 and the second nitride material 208, the third nitride material 213 may be formed from a nitride material selected for dielectric properties. For example, the third nitride material 213 may be formed from the same material as the first nitride material 205 and the second nitride material 208. The third nitride material 213 may, in a number of examples, be deposited to a thickness in a range of from approximately 70 nm to approximately 250 nm above the surface of the third silicate material 212.

With more height, a resultant surface area for a capacitor structure may be increased allowing for a greater storage capacitance value. In some embodiments, a spacer oxide material 214 may be used to increase the surface area of the capacitor structure. In order to widen the space between electrode materials 232, a spacer oxide material 214 may be deposited on the upper surfaces of the semiconductor structure. The spacer oxide material 214 may be deposited on the upper surface of the third nitride material 213 and the upper surface of the electrode material 232. That is, the spacer oxide material 214 may be deposited on the upper surface of the third nitride material 213 and between electrode materials 232.

A wet etch may be used to increase the space between electrode materials 232. The wet etch may be used to decrease the spacer oxide material 214 width, thereby increasing the width between electrode materials 232. The wet etch may be carried out using a dilute hydrofluoric (HF) acid combination. The HF may be diluted with water at a ratio between 500 to 2500 parts hydrofluoric acid to 1 part water. The HF may selectively target the spacer oxide material 214, not the electrode material 232. The wet etch may be used to increase the width between electrode materials 232 by a range between 1-10 nanometers (nm). In some embodiments, the widened width between the electrode materials 232 may produce a capacitance gain between 1 to 10 femto Farads (fF).

A dry etch may be subsequently used to etch a portion of the materials within the plurality of pillars 209, particularly the third nitride material 213. The dry etch may etch a portion of the spacer oxide material 214 and a portion of the third nitride material 213. The opening 202 created by the previous dry etch process may be observed, starting at the upper surface of the first nitride material 205 to the surface of the first silicate material 203.

In at least one example, the width or diameter of the electrode materials, between the plurality of pillars 209 may be within a range of approximately 100-500 Angstroms (or 10 to 50 nm) and the height of the openings 232 may be within a range of approximately 8,000-25,000 Angstroms (800-2,500 nm) and may result in an aspect ratio (AR) of the height to width being in a range of approximately 25:1 to approximately 75:1.

The resultant semiconductor structure may have a height 222 in a range of from approximately 8,000 Angstroms (or 800 nm) to approximately 25,000 Angstroms (or 1,500 nm). Each of the materials may contribute a particular height to the overall height 222 of the structure. As is illustrated in FIG. 2, the first silicate material 203 can have a height 224-1, the remaining portion of the first nitride material 205 can have a height 224-2, the second silicate material 206 can have a height 224-3, the second nitride material 208 can have a height 224-4, the third silicate material 212 can have a height 224-5, and the third nitride material 213 can have a height 224-6 that, when added together, results in the overall height 222. The overall height 222 may be greater than 15,000 angstroms.

In some examples, the height 224-1 of the first silicate material 203 can be one of approximately 2000 Angstroms, approximately 2400 Angstroms, approximately 3600 Angstroms, approximately 4000 Angstroms, approximately 4500 Angstroms, approximately 5300 Angstroms, approximately 5800 Angstroms, approximately 6200 Angstroms, approximately 7000 Angstroms, and/or within a range from approximately 2000 Angstroms to approximately 7500 Angstroms. In some examples, the height 224-2 of the first nitride material 205 can be one of approximately 50 Angstroms, approximately 100 Angstroms, approximately 400 Angstroms, approximately 600 Angstroms, and/or within a range from approximately 50 to approximately 650 Angstroms. In some examples, the height 224-3 of the second silicate material 206 can be one of approximately 2500 Angstroms, approximately 3500 Angstroms, approximately 5200 Angstroms, and/or within a range from approximately 2500 to 6000 Angstroms. In some examples, the height 224-4 of the second nitride material 208 can be one of approximately 50 Angstroms, approximately 100 Angstroms, approximately 175 Angstroms, approximately 270 Angstroms, and/or within a range from approximately 50 to approximately 300 Angstroms. In some examples, the height 224-5 of the third silicate material 212 can be one of approximately 1000 Angstroms, approximately 2500 Angstroms, approximately 4000 Angstroms, and/or within a range from approximately 1000 to 4500 Angstroms. In some examples, the height 224-6 of the third nitride material 213 can be one of approximately 700 Angstroms, approximately 950 Angstroms, approximately 1200 Angstroms, approximately 2500 Angstroms, and/or within a range from approximately 700 to approximately 2500 Angstroms. However, embodiments of the present disclosure are not limited to this example.

Figure 3:
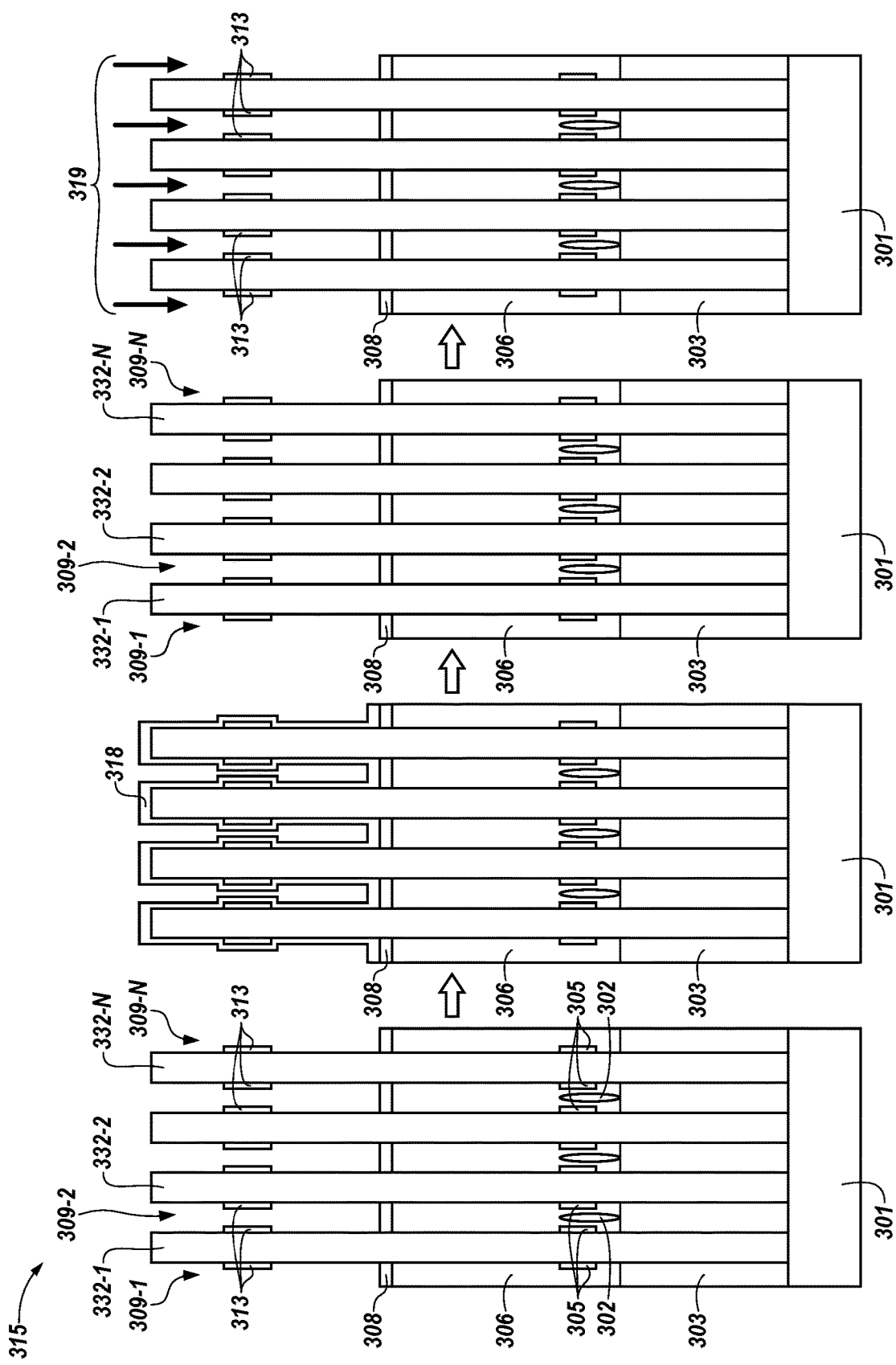

FIG. 3 illustrates a cross-sectional view 315 of a portion of semiconductor structure of a memory device in association with a semiconductor fabrication sequence for stacking a semiconductor structure in accordance with a number of examples of the present disclosure. FIG. 3 illustrates the example semiconductor structure following completion of the example fabrication sequence described in connection with FIG. 2.

The cross-sectional view 315 can include the same or similar elements as the example cross-sectional views 100 and 211 as referenced in FIGS. 1 and 2, respectively. For example, the working surface 301 is analogous or similar to working surface 101 and 201 of FIGS. 1 and 2, respectively. The first silicate material 303 is analogous or similar to first silicate material 103 and 203 of FIGS. 1 and 2, respectively. The first nitride material 305 is analogous or similar to first nitride material 105 and 205 of FIGS. 1 and 2, respectively. The second silicate material 306 is analogous or similar to second silicate material 106 and 206 of FIGS. 1 and 2, respectively. The second nitride material 308 is analogous or similar to second nitride material 108 and 208 of FIGS. 1 and 2, respectively.

A dry etch may be used to etch away the third silicate material (illustrated as 212 in FIG. 2). Traces of the spacer oxide material may also be etched away during the dry etch process. The semiconductor structure may then consist of the first silicate material 303, a portion of the first nitride material 305, the opening 302 within the plurality of pillars 309, the second silicate material 306, the second nitride material 308, and a portion of the third nitride material 313.

A wet etch may subsequently be used to increase the space between electrode materials 332. The wet etch may be used to widen the width between electrode materials 332. A liner 318 may be deposited on the exposed surface area of the semiconductor materials. The liner 318 may be deposited on the upper surface of the second nitride material 308 and the upper surface of the electrode materials 332. That is, the liner 318 may be deposited on the upper surface of the second nitride material 308 and between electrode materials 332. The liner 318 may be formed from a nitride material selected for its resistive properties. The liner 318 may be resistant to a wet etch process. The liner 318 may be used to pinch off small gaps within the second nitride material 308 such that the wet etch does not seep into the materials within the plurality of pillars 309 below. The liner 318 may be selected from one or more conductive nitrides such as gallium nitride (GN), tantalum nitride (TaN, Ta2N), titanium nitride (TiN, Ti2N), aluminum doped titanium nitride (TiAlN), and silicon doped titanium nitride (TiSiN), among other possibilities.

A pulsed plasma doping (PLAD) 319 is subsequently used to change the composition of a buried nitride. Here, the buried nitride is the remaining portion of the first nitride material 305. The PLAD 319 is used to change the composition of the first nitride material 305 to hasten the etch process to take out the remaining materials within the plurality of pillars 309. The remaining materials within the plurality of pillars 309 include the first silicate material 303, the second silicate material 306 and the second nitride material 308. The PLAD 319 applies a pulsed voltage to a wafer immersed in a plasma of dopant ions. The ions from the plasma are accelerated and implanted in the wafer. The pulses are repeated until the desired composition change is achieved. That is, until the composition of the first nitride material 305 has been changed and is more susceptible to an etch process.

Figure 4:
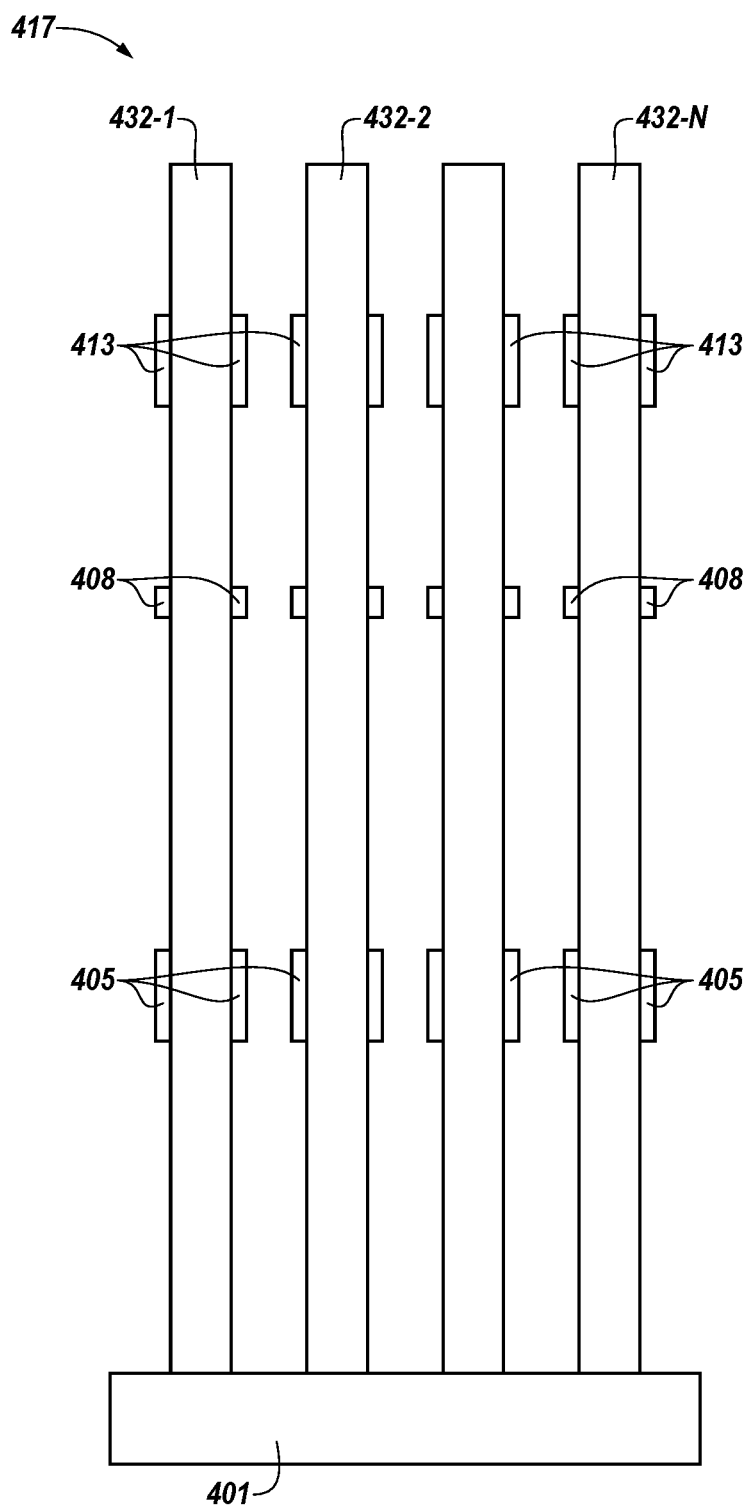

FIG. 4 illustrates a cross-sectional view 417 of a portion of semiconductor structure of a memory device in association with a semiconductor fabrication sequence for stacking a semiconductor structure in accordance with a number of examples of the present disclosure. FIG. 4 illustrates the example semiconductor structure following completion of the example fabrication sequence described in connection with FIG. 3.

The cross-sectional view 417 can include the same or similar elements as the example cross-sectional views 100, 211, and 315 as referenced in FIGS. 1, 2, and 3 respectively. For example, the working surface 401 is analogous or similar to working surface 101, 201, and 301 of FIGS. 1, 2, and 3 respectively. The first nitride material 405 is analogous or similar to first nitride material 105, 205, and 305 of FIGS. 1, 2, and 3 respectively. The third nitride material 412 is analogous or similar to second nitride material 212, and 312 of FIGS. 2 and 3 respectively.

A wet etch may be used to remove the materials within the plurality of pillars. That is the wet etch may be used to remove the materials between the electrode materials 432. The plurality of pillars (309 as illustrated in FIG. 3) contained the first silicate material, the second silicate material and a portion of the second nitride material 408. The wet etch may be carried out using a dilute hydrofluoric (HF) acid combination.

The stacking process may produce a high aspect ratio semiconductor structure. The semiconductor structure may be described as self aligning because the plurality of pillars is aligned without requiring photo assistance to widen the space between neighboring plurality of pillars. The structure may have a height to width in a range of approximately 25:1 to approximately 75:1 with increased capacitance due to a wider width for the electrode materials 432. Through this process, the width for the electrode materials 432 was increased by a range between 1-4 nanometers (nm).

Figure 5:
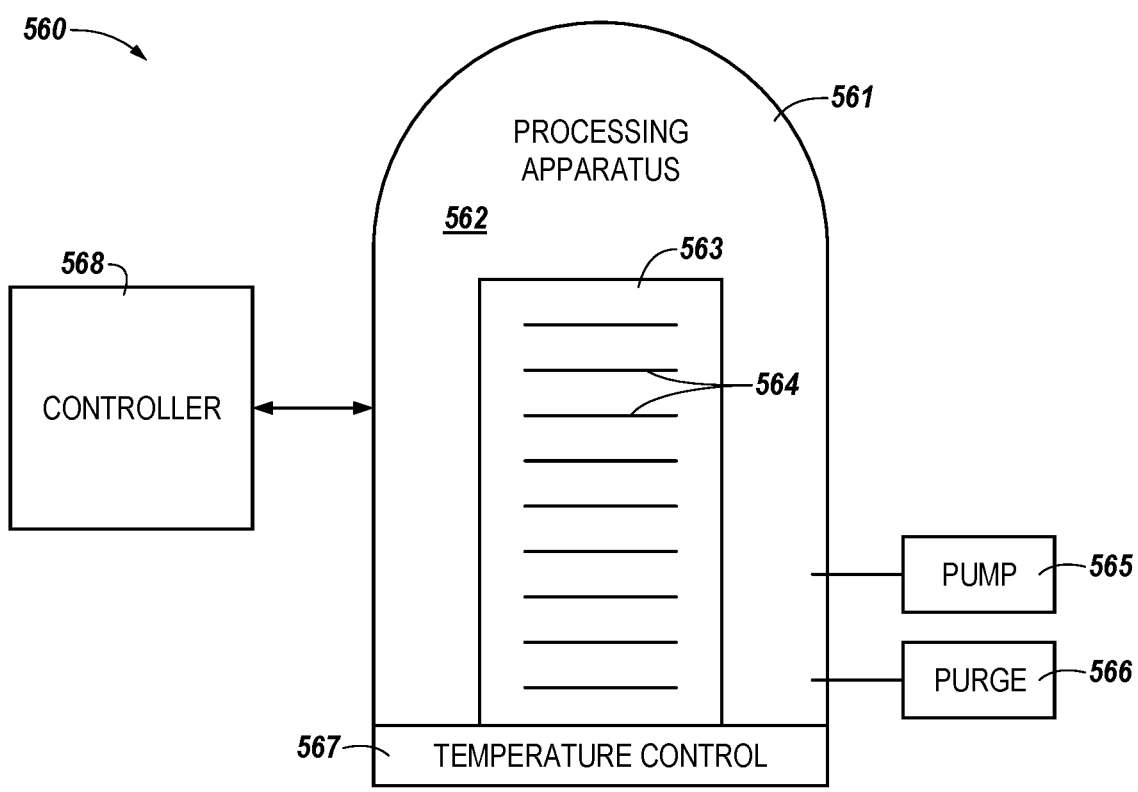
FIG. 5 is a functional block diagram of a system for implementation of an example semiconductor fabrication process in accordance with a number of embodiments of the present disclosure.

FIG. 5 is a functional block diagram of a system 560 for implementation of an example semiconductor fabrication process in accordance with a number of embodiments of the present disclosure. The system 560 can include a processing apparatus 561. The processing apparatus 561 can be configured to enable stacking a semiconductor structure.

The processing apparatus 561 can include a semiconductor processing chamber 562 to enclose components configured to stack a semiconductor structure. The chamber 562 can further enclose a carrier 563 to hold a batch of semiconductor wafers 564 (e.g., the working surface 101). The processing apparatus 561 can include and/or be associated with tools including, for example, a pump 565 unit and a purge 566 unit configured to introduce and remove reducing agents. The processing apparatus 561 can further include a temperature control 567 unit configured to maintain the chamber 562 at appropriate temperatures as described herein.

The system 560 can further include a controller 568. The controller 568 can include, or be associated with, circuitry and/or programming for implementation of, for instance, stacking a semiconductor structure. Adjustment of such deposition and purging operations by the controller 568 can control the thickness of the materials described herein (such as the first silicate material, the first nitride material, the first silicate material, the second nitride material, the third silicate material and the third nitride material).

The controller 568 can, in a number of embodiments, be configured to use hardware as control circuitry. Such control circuitry may, for example, be an application specific integrated circuit (ASIC) with logic to control fabrication steps, via associated deposition and purge processes, for stacking a semiconductor structure.

Figure 6:
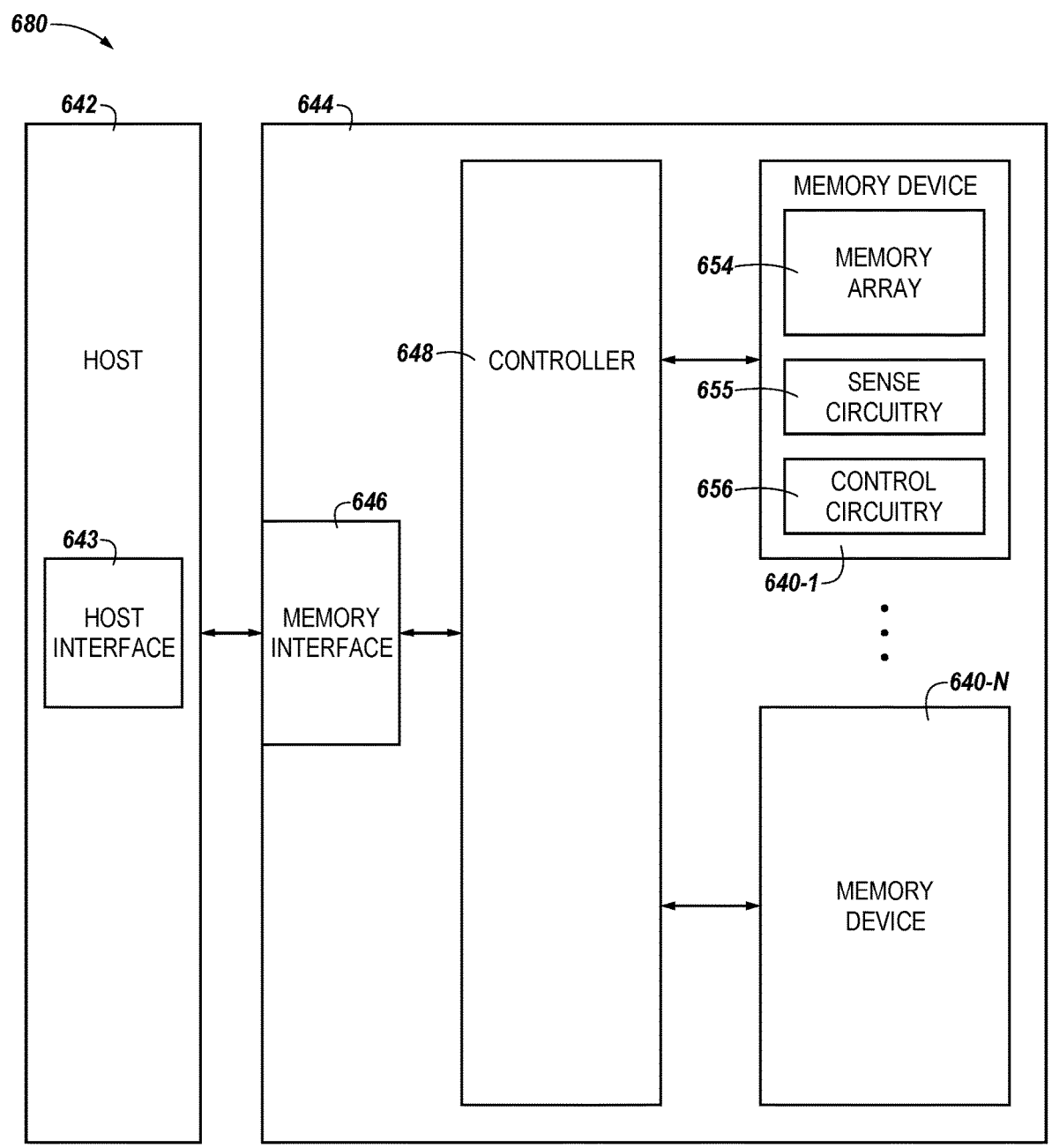
FIG. 6 illustrates a functional block diagram of an example computing system including a semiconductor structure of a memory system in accordance with a number of examples of the present disclosure.

FIG. 6 is a functional block diagram of an example computing system including a semiconductor structure of a memory system in accordance with a number of examples of the present disclosure. Memory system 644 may be, for example, a solid-state drive (SSD).

In the example illustrated in FIGS. 1-4, memory system 644 includes a memory interface 646, a number of memory devices 640-1, . . . , 640-N, and a controller 648 selectably coupled to the memory interface 646 and memory devices 640-1, . . . , 640-N. Memory interface 646 may be used to communicate information between memory system 644 and another device, such as a host 642. Host 642 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host may be associated with fabrication operations performed on semiconductor devices and/or SSDs using, for example, a processing.

In a number of examples, host 642 may be associated with (e.g., include or be coupled to) a host interface 643. The host interface 643 may enable input of scaled preferences (e.g., in numerically and/or structurally defined gradients) to define, for example, critical dimensions (CDs) of a final structure or intermediary structures of a memory device (e.g., as shown at 640) and/or an array of memory cells (e.g., as shown at 654) formed thereon to be implemented by the processing apparatus. The scaled preferences may be provided to the host interface 643 via input of a number of preferences stored by the host 642, input of preferences from another storage system (not shown), and/or input of preferences by a user (e.g., a human operator).

Memory interface 646 may be in the form of a standardized physical interface. For example, when memory system 644 is used for information (e.g., data) storage in computing system 680, memory interface 646 may be a serial advanced technology attachment (SATA) interface, a peripheral component interconnect express (PCIe) interface, or a universal serial bus (USB) interface, among other physical connectors and/or interfaces. In general, however, memory interface may provide an interface for passing control, address, information, scaled preferences, and/or other signals between the controller 648 of memory system 644 and a host 642 (e.g., via host interface 643).

Controller 648 may include, for example, firmware and/or control circuitry (e.g., hardware). Controller 648 may be operably coupled to and/or included on the same physical device (e.g., a die) as one or more of the memory devices 640-1, . . . , 640-N. For example, controller 648 may be, or may include, an ASIC as hardware operably coupled to circuitry (e.g., a printed circuit board) including memory interface 646 and memory devices 640-1, . . . , 640-N. Alternatively, controller 648 may be included on a separate physical device that is communicatively coupled to the physical device (e.g., the die) that includes one or more of the memory devices 640-1, . . . , 640-N.

Controller 648 may communicate with memory devices 640-1, . . . , 640-N to direct operations to sense (e.g., read), program (e.g., write), and/or erase information, among other functions and/or operations for management of memory cells. Controller 648 may have circuitry that may include a number of integrated circuits and/or discrete components. In a number of examples, the circuitry in controller 648 may include control circuitry for controlling access across memory devices 640-1, . . . , 640-N and/or circuitry for providing a translation layer between host 642 and memory system 644.

Memory devices 640-1, . . . , 640-N may include, for example, a number of memory arrays 654 (e.g., arrays of volatile and/or non-volatile memory cells). For instance, memory devices 640-1, . . . , 640-N may include arrays of memory cells, such as a portion of an example memory device 690 structured to form structures formed according to embodiments described in FIGS. 1-4, described in connection with FIG. 6. As will be appreciated, the memory cells in the memory arrays 654 of memory devices 640-1, . . . , 640-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 640 may be formed on the same die. A memory device (e.g., memory device 640-1) may include one or more arrays 654 of memory cells formed on the die. A memory device may include sense circuitry 655 and control circuitry 656 associated with one or more arrays 654 formed on the die, or portions thereof. The sense circuitry 655 may be utilized to determine (sense) a particular data value (e.g., 0 or 1) that is stored at a particular memory cell in a row of an array 654. The control circuitry 656 may be utilized to direct the sense circuitry 655 to sense particular data values, in addition to directing storage, erasure, etc., of data values in response to a command from host 642 and/or host interface 643. The command may be sent directly to the control circuitry 656 via the memory interface 646 or to the control circuitry 656 via the controller 648.

The example illustrated in FIG. 6 may include additional circuitry that is not illustrated so as not to obscure examples of the present disclosure. For example, memory devices 640 may include address circuitry to latch address signals provided over I/O connectors through I/O circuitry. Address signals may be received and decoded by a row decoder and a column decoder to access a memory array 654. It will be appreciated that the number of address input connectors may depend on the density and/or architecture of memory devices 640 and/or memory arrays 654.

Figure 7:
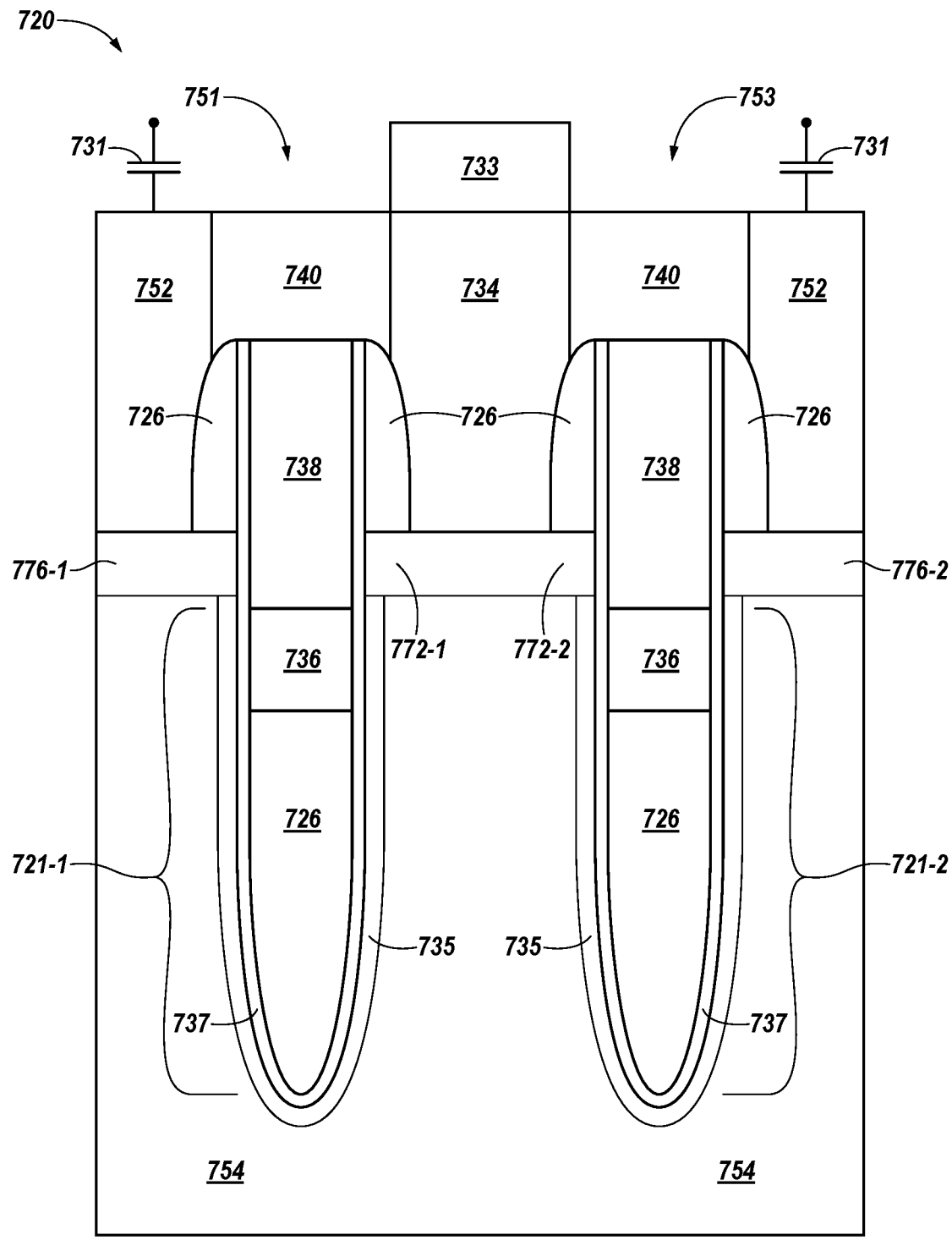
FIG. 7 illustrates a cross-sectional view of an access device which can be coupled to a storage node having an electrode in accordance with a number of embodiments of the present disclosure.

FIG. 7 illustrates a cross-sectional view of an apparatus 720 showing a pair of neighboring memory cells sharing a source/drain region, e.g., 771-1 and 772-2, and a sense line contact 734 connecting to a passing sense line 752. The pair of neighboring memory cells include access devices 753 coupled to storage node contact 752 and storage nodes 731 in accordance with a number of embodiments of the present disclosure. FIG. 7 illustrates gates 751-1, . . . , 751-N (individually or collectively referred to as gate 751) during a fabrication process. The gate 751 can also be referred to as a gate electrode. The gate 751 may be a gate to a recessed access device, e.g., a buried recessed access device (BRAD). In the example shown, the gate 751 may include a first portion 726 including a metal, e.g., titanium nitride (TiN), and a second portion 786 including a doped polysilicon to form a hybrid metal gate (HMG) 751. The gate 751 may be separated from a channel 735, separating a first source/drain region 776-1 and 776-2 (collectively referred to as first source/drain region 776) and a second source/drain region 772-1 and 772-2 (collectively referred to as second source/drain region 772) by a gate dielectric 737. In the example of FIG. 1, two neighboring access devices 751 and 753 are shown sharing a second source/drain region 772 at a junction. The neighboring access devices 751 and 753 may be formed on a working surface of a semiconductor material on a working surface material 754.

In the example of FIG. 7, a storage node (shown schematically for ease of illustration) is connected to a storage node contact 752 formed in accordance with the techniques described herein. The storage node contact 752 may be connected to an active area, e.g., a first source/drain region 776 of an access device 753. An insulation material 740 (e.g., a dielectric material) can be formed on the spacer material 726 and the gate mask material 738, and in contact with the metallic material 734. In at least one embodiment, a first portion 728 of the metallic material 734 can be formed in contact with the spacer material 726, the source/drain regions 772 and 776, and the junction. The insulation material 740 can be formed on the spacer material 726 and the gate mask material 738, and in contact with the metallic material 734.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to stacking a semiconductor structure have been illustrated and described herein, examples of the present disclosure are not limited to those combinations explicitly recited herein. Other combinations and configurations of the semiconductor materials, underlying materials, structural materials, dielectric materials, capacitor materials, substrate materials, working surfaces, silicate materials, nitride materials, buffer materials, etch chemistries, etch processes, solvents, memory devices, memory cells, sidewalls of openings and/or trenches related to stacking a semiconductor structure than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure.

It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method, comprising:
    stacking a semiconductor structure between electrode materials having:
        a first silicate material on a working surface;
        a first nitride material on the first silicate material;
        a second silicate material on the first nitride material;
        a second nitride on the second silicate material;
        a third silicate material on the second nitride; and
        a third nitride on the third silicate material;
    using a wet etch process to increase a width between electrode materials; and
    using a dry etch process to remove a portion of materials within the semiconductor structure.

2. The method of claim 1, further comprising patterning the combination of the first silicate material, the first nitride material, the second silicate material, the second nitride material, the third silicate material, and the third nitride material to a height of greater than 15,000 Angstroms.

3. The method of claim 1, further comprising etching the first nitride material before depositing the second silicate material.

4. The method of claim 1, further comprising widening the width of the semiconductor structure using a wet etch.

5. The method of claim 4, further comprising widening the width of the semiconductor structure by a range between 1-10 nanometers (nm).

6. The method of claim 1, further comprising etching the first nitride material using phosphoric acid.

7. A method, comprising:
    patterning a semiconductor structure between electrode materials having a first silicate material on a nitride working surface and a first nitride material on the first silicate material;
    etching the first nitride material using a dry etch process;
    patterning a second silicate material on the first nitride material, a second nitride on the second silicate material, a third silicate material on the second nitride, and a third nitride on the third silicate material;
    using a wet etch process to increase a width between electrode materials; and
    using a dry etch process to remove the third silicate material and a portion of the third nitride material.

8. The method of claim 7, further comprising patterning the first silicate material to a height between 2,000 Angstroms and 7,500 Angstroms.

9. The method of claim 7, further comprising patterning the second silicate material to a height between 2,500 Angstroms and 6,000 Angstroms.

10. The method of claim 7, further comprising depositing a liner to protect the nitride material from a wet etch process.

11. The method of claim 10, further comprising depositing a doped nitride liner to protect the nitride material from a wet etch process.

12. The method of claim 7, further comprising patterning the third silicate material to a height between 1,000 Angstroms and 4,500 Angstroms.

13. The method of claim 7, further comprising depositing a spacer oxide onto the first nitride material before patterning the second silicate material.

14. The method of claim 13, further comprising etching the spacer oxide using a wet etch process to widen the width of the semiconductor structure.

15. A method, comprising:
    patterning a semiconductor structure between electrode materials having:
        a borophosphosilicate glass (BPSG) material on a nitride working surface;
        a first nitride material on the BPSG material;
        a second BPSG material on the first nitride material;
        a second nitride on the second BPSG material;
        a tetraethyl orthosilicate (TEOS) material on the second nitride material; and
        a third nitride material on the TEOS material;
    using a wet etch process to increase a width between electrode materials; and
    using a dry etch process to remove the TEOS material and a portion of the third nitride material.

16. The method of claim 15, further comprising patterning the first nitride material to a height between 50 Angstroms and 650 Angstroms.

17. The method of claim 15, further comprising depositing a liner to protect the first nitride material and the second nitride material from a pulsed plasma doping (PLAD) process.

18. The method of claim 17, further comprising depositing a doped nitride material liner to protect the first nitride material and the second nitride material from the PLAD process.

19. The method of claim 15, further comprising increasing a capacitance of the semiconductor structure to a range between 1 to 9 femto Farads (fF).

20. The method of claim 15, further comprising patterning the second nitride material to a height between 50 Angstroms and 300 Angstroms.

21. The method of claim 15, further comprising patterning the first, second and the third nitride materials to include one of a silicon nitride (SiN) and a titanium nitride (TiN).

22. The method of claim 15, further comprising patterning the third nitride material to a height between 700 and 2,500 Angstroms.

23. The method of claim 15, further comprising performing the wet etch process using a dilute hydrofluoric (HF) acid combination.

24. The method of claim 23, further comprising performing the wet etch process using a diluted solution of water to HF, with a range between 500-2500 parts HF to 1 part water.

* * * * *